(12) United States Patent
Sajid et al.

(10) Patent No.: US 8,881,080 B2
(45) Date of Patent: Nov. 4, 2014

(54) METHOD AND APPARATUS FOR ENHANCED STATIC IR DROP ANALYSIS

(71) Applicant: QUALCOMM Incorporated, San Diego, CA (US)

(72) Inventors: Khusro Sajid, Austin, TX (US); Mamta Bansal, San Diego, CA (US); Karim Arabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/725,976

(22) Filed: Dec. 21, 2012

(65) Prior Publication Data

US 2014/0181771 A1    Jun. 26, 2014

(51) Int. Cl.
*G06F 17/50* (2006.01)

(52) U.S. Cl.
CPC ................................ *G06F 17/5081* (2013.01)
USPC ....................................................... 716/113

(58) Field of Classification Search
USPC .................................................. 716/100, 113
See application file for complete search history.

(56) References Cited

U.S. PATENT DOCUMENTS

| | | |
|---|---|---|
| 6,249,898 B1 | 6/2001 | Koh et al. |
| 7,007,256 B2 | 2/2006 | Sarkar et al. |
| 7,110,930 B2 | 9/2006 | Chiu et al. |
| 7,194,714 B2 * | 3/2007 | Kartschoke et al. .......... 716/114 |
| 7,669,151 B1 * | 2/2010 | Boyle et al. .................... 716/115 |
| 7,877,713 B2 | 1/2011 | Kariat et al. |
| 7,954,000 B2 * | 5/2011 | Allen et al. .................... 713/502 |
| 2005/0086620 A1 * | 4/2005 | Kartschoke et al. .............. 716/6 |
| 2009/0183019 A1 * | 7/2009 | Allen et al. .................... 713/503 |
| 2011/0313738 A1 | 12/2011 | Stamoulis et al. |

* cited by examiner

*Primary Examiner* — Suchin Parihar
(74) *Attorney, Agent, or Firm* — Paul S. Holdaway (57) ABSTRACT

Methods and apparatus for Enhanced Static IR Drop Analysis are provided. Enhanced Static IR Drop Analysis can be used to determine a quality and robustness of a power distribution network in a circuit. In examples, Enhanced Static IR Drop Analysis includes recording time points at which global current demand profile peaks, sampling instantaneous current from individual tile-based current demand profiles at each time point, and running Static IR Analysis for the tiles at the time points to determine tile current use by the tiles during the time points. Enhanced Static IR Drop Analysis can be used for quick assessment of peak current distribution and determining how the peak current distribution stresses the power distribution network. Enhanced Static IR Drop Analysis is useful during earlier stages of circuit design, when quickly producing circuit performance data is imperative and conventional techniques require significant resources.

30 Claims, 9 Drawing Sheets

METHOD AND APPARATUS FOR ENHANCED STATIC IR DROP ANALYSIS

FIELD OF DISCLOSURE

This disclosure relates generally to electronics, and more specifically, but not exclusively, to methods and apparatus for Enhanced Static IR Drop Analysis.

BACKGROUND

Today's ultra-deep sub-micron very large scale integration (VLSI) circuit designs are extremely complex, and are characterized by escalating gate counts, shrinking wire widths, and bigger die size. The higher gate count leads to worsening on-chip average and peak current demand, while smaller wire widths directly contribute to higher power grid (PG) mesh resistance. The combination of higher peak current demand and higher PG grid resistance degrades on-chip IR (i.e., current*resistance) drop and makes Power Delivery Network (PDN) signoff a complicated and challenging task. PDN analysis and verification has emerged as a key component in modern power sign-off methodology.

Industry-standard methods for analyzing overall PDN robustness and quality include Dynamic Voltage Drop Analysis based on instantaneous current demand, as well as Static IR Analysis based on average power. Both of these techniques have become an integral part of strategies for power signoff in today's System-on-a-chip (SoC) designs. The effectiveness of these methods lies mostly in being able to run them during early stages of a physical design cycle (e.g., a floorplan stage), when power grid design changes are easier to adopt and implement.

Dynamic Voltage Drop Analysis is a technique that can provide a software-accurate voltage drop for each instance on a die, based on instantaneous current demand due to switching activity in a real application. However, there is limited availability of representative current demand profiles that can model the numerous applications for SoC devices. Dynamic Voltage Drop Analysis is also time consuming, complicated, and a cumbersome effort that often entails elaborate and error-prone setup, large analysis runtimes, and complicated post-processing of results. Thus, Dynamic Voltage Drop Analysis often does not provide timely feedback to a circuit designer about the robustness and quality of the PDN during the early physical design stages.

Static IR Analysis based on average power is another of the industry-standard methods. This technique provides quick feedback to the circuit designer, primarily for two reasons. First, the circuit designer has a fairly good estimate of worst case average power consumption and second, the leading Electronic Design Automation (EDA) tools for PDN analysis have fast and accurate Static IR drop solver engines. The result is that Static IR Analysis based on average power provides a fairly fast and accurate estimation of on-chip Static IR drop distribution. Though testing using Static IR Analysis based on average power is easy to setup and can generate quick feedback in a reasonable amount of time, the power distribution used is based on average power, which does not account for changes in on-chip power distribution as a function of time. Thus, Static IR Analysis based on average power cannot determine if a power grid is robust enough to withstand peak current demand. Relying solely on average power-based Static IR Analysis based on average power results to assess PDN bottlenecks early in the design process can provide unexpected detrimental results.

Accordingly, there are long-felt industry needs for methods and apparatus that improve upon conventional methods and apparatus, including methods and apparatus for Enhanced Static IR Drop Analysis.

SUMMARY

This summary provides a basic understanding of some aspects of the present teachings. This summary is not exhaustive in detail, and is neither intended to identify all critical features, nor intended to limit the scope of the claims.

Exemplary methods and apparatus for performing enhanced static IR analysis on a device are provided. In one exemplary method for performing enhanced static IR analysis on a device, a block of the device is selected. The block is partitioned into a plurality of tiles. An individual current demand profile for each tile in the plurality of tiles is determined. The individual current demand profiles are added to determine a global current demand profile for the block. Peak time points at which the global current demand profile peaks are determined. Instantaneous current values for each tile at the peak time points are determined from the individual current demand profiles. A static IR analysis is performed on the instantaneous current values for each tile. The static IR analysis can be performed during an early design stage of the device. Further, the individual current demand profile for a tile of the plurality of tiles can be recorded for future use. The individual current demand profile for a tile of the plurality of tiles can be retrieved and used to estimate an individual current demand profile of a second tile in a second block.

Provided are three exemplary methods for determining the individual current demand profile for a tile. In a first method, switching activity of leaf instances of the tile is analyzed. Switching time points at which the leaf instances switch are determined. Currents drawn by the leaf instances at the switching time points are determined. The currents drawn by the leaf instances at the switching time points are summed to determine the individual current demand profile for the tile. In a second method, a second block having substantially similar functionality and size as the selected block is identified. The individual current demand profiles of tiles in the second block are known. The individual current demand profile for the tile of the selected block is assigned to be equal to the known individual current demand profile of a corresponding tile of the second block. In a third method, the individual current demand profile for a tile is determined by assigning a triangular or trapezoidal current demand profile to the tile.

In a further example, provided is a non-transitory computer-readable medium, comprising instructions stored thereon that, if executed by a processor, cause the processor to execute at least a part of the aforementioned methods. The non-transitory computer-readable medium can be integrated with a computer.

In another example, provided is an apparatus configured to perform enhanced static IR analysis on a device. The apparatus includes means for selecting a block of the device, means for partitioning the block into a plurality of tiles, means for determining an individual current demand profile for each tile in the plurality of tiles, means for adding the individual current demand profiles to determine a global current demand profile for the block, means for determining peak time points at which the global current demand profile peaks, means for determining, from the individual current demand profiles, instantaneous current values for each tile at the peak time points, and means for performing a static IR analysis on the instantaneous current values for each tile. The static IR analysis can be performed during an early design stage of the device. The apparatus can also include means for recording the individual current demand profile for a tile of the plurality of tiles. The apparatus can also include means for retrieving the individual current demand profile for a tile of the plurality of tiles and using the retrieved individual current demand profile to estimate an individual current demand profile of a second tile in a second block.

The individual current demand profile for a tile can be determined by means for analyzing switching activity of leaf instances of the tile, means for determining switching time points at which the leaf instances switch, means for determining currents drawn by the leaf instances at the switching time points; and means for summing the currents drawn by the leaf instances at the switching time points to determine the individual current demand profile for the tile. Optionally, the individual current demand profile for a tile can be determined by means for identifying a second block having substantially similar functionality and size as the selected block, where individual current demand profiles of tiles in the second block are known, and means for assigning the individual current demand profile for the tile of the selected block to be equal to the known individual current demand profile of a corresponding tile of the second block. The individual current demand profile for a tile can also be determined by means for assigning a triangular or trapezoidal current demand profile to the tile.

Further, at least a part of the apparatus can be integrated on a semiconductor die and/or be integrated with a device, such as a computer. In a further example, provided is a non-transitory computer-readable medium, comprising instructions stored thereon that, if executed by a lithographic device, cause the lithographic device to fabricate at least a part of the apparatus.

In another example, provided is an apparatus configured to perform enhanced static IR analysis on a device. The apparatus includes a processor configured to perform at least one of the following: select a block of the device; partition the block into a plurality of tiles; determine an individual current demand profile for each tile in the plurality of tiles; add the individual current demand profiles to determine a global current demand profile for the block; determine peak time points at which the global current demand profile peaks; determine, from the individual current demand profiles, instantaneous current values for each tile at the peak time points; and perform a static IR analysis on the instantaneous current values for each tile. The processor can be configured to perform the static IR analysis during an early design stage of the device. The processor can be further configured to record the individual current demand profile for a tile of the plurality of tiles. The processor can be further configured to retrieve the individual current demand profile for a tile of the plurality of tiles and use the retrieved individual current demand profile to estimate an individual current demand profile of a second tile in a second block.

The processor can be further configured to determine the individual current demand profile for a tile by: analyzing switching activity of leaf instances of the tile; determining switching time points at which the leaf instances switch; determining currents drawn by the leaf instances at the switching time points; and summing the currents drawn by the leaf instances at the switching time points to determine the individual current demand profile for the tile. The processor can be further configured to determine the individual current demand profile for a tile by: identifying a second block having substantially similar functionality and size as the selected block, where individual current demand profiles of tiles in the second block are known; and assigning the individual current demand profile for the tile of the selected block to be equal to the known individual current demand profile of a corresponding tile of the second block. The processor can be further configured to determine the individual current demand profile for a tile by assigning a triangular or trapezoidal current demand profile to the tile.

Optionally, at least a part of the apparatus is integrated on a semiconductor die and/or at least a part of the apparatus can be integrated with a device, such as a computer. In a further example, provided is a non-transitory computer-readable medium, comprising instructions stored thereon that, if executed by a lithographic device, cause the lithographic device to fabricate at least a part of the apparatus.

The foregoing broadly outlines some of the features and technical advantages of the present teachings in order that the detailed description and drawings can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The novel features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

Methods and apparatus for Enhanced Static IR (i.e., current*resistance) Drop Analysis are provided. Enhanced Static IR Drop Analysis can be used to determine a quality and robustness of a power distribution network in a circuit. Enhanced Static IR Drop Analysis can be used for quick assessment of peak current distribution and determining how the peak current distribution stresses a power distribution network (PDN). Enhanced Static IR Drop Analysis is useful during earlier stages of circuit design, when quickly producing circuit performance data is imperative and conventional techniques require significant resources.

Enhanced Static IR Drop Analysis uses peak current demand data instead of average power distribution data. In examples, Enhanced Static IR Drop Analysis includes recording time points at which global current demand profile peaks, sampling instantaneous current from individual tile-based current demand profiles at each time point, and running Static IR Analysis for the tiles at the time points to determine tile current use by the tiles during the time points.

Enhanced Static IR Drop Analysis provides several advantages over conventional techniques. For example, one advantage is improved accuracy. Another advantage is an ability to pin-point power grid deficiencies that would otherwise go undetected when performing traditional analysis using average power distribution data. Further advantages include reducing dependency on Dynamic Voltage Drop analysis, providing early feedback on power distribution network integrity, and offering enhanced effectiveness over conventional Static IR Analysis techniques.

An additional advantage is that data generated by Enhanced Static IR Drop Analysis performed on a previously-designed block can be re-used for a new block instantiated inside a new circuit (i.e., an integrated circuit, system-on-a-chip (SoC)). If the new circuit has a slightly different version of an earlier block, instead of performing Enhanced Static IR Drop Analysis on the new block early in the design process, results of Enhanced Static IR Drop Analysis previously performed on a tile-based model of the earlier block can be reused for the new block. The new block may have minor functional changes leading to PDN changes as well. Thus, a quick assessment of an impact due to the new PDN changes inside the new block can be made by performing Enhanced Static IR Drop Analysis on the peak power distribution model from the earlier block.

Furthermore, for any design, Enhanced Static IR Drop Analysis provides an effective tool to perform a what-if analysis of a circuit's power grid. An impact of changing wire widths, as well as removing and/or adding wires and/or vias can be quickly assessed by analyzing peak currents per tile.

Moreover, if results of the Enhanced Static IR Drop Analysis indicate that at least one tile consistently consumes a high quantity of current relative to other tiles, then tiles consuming the high quantity of current can be identified as requiring careful examination to determine the basis for the high current consumption. The examination can include analyzing decap density, connectivity to bumps, mesh resistance, and power grid deficiencies of the tiles consuming the high quantity of current.

Another advantage of Enhanced Static IR Drop Analysis is that Enhanced Static IR Drop Analysis is useful not only at the block level, but can also be deployed at a chip level. The tile-based representation of hierarchical blocks, proper representation of virtual regions and their peak power assignment, and worst case power assignment for memories and/or custom blocks can be used to create a database of Enhanced Static IR Drop Analysis results that can be used to provide early feedback on robustness of a chip-level power distribution network.

Examples of the current teachings are disclosed in this application's text and drawings. The examples advantageously address the long-felt industry needs, as well as other previously unidentified needs, and mitigate shortcomings of the conventional methods and apparatus. Alternate embodiments can be devised without departing from the scope of the invention. Additionally, conventional elements of the current teachings may not be described in detail, or may be omitted, to avoid obscuring aspects of the current teachings.

As used herein, the term "exemplary" means "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables, and/or printed electrical connections, as well as by the use of electromagnetic energy, such as electromagnetic energy having wavelengths in the radio frequency region, the microwave region and/or the optical (both visible and invisible) region, as several non-limiting and non-exhaustive examples.

It should be understood that the term "signal" can include any signal such as a data signal, audio signal, video signal, and/or a multimedia signal. Information and signals can be represented using any of a variety of different technologies and techniques. For example, data, instructions, process step, commands, information, signals, bits, symbols, and/or chips that are referenced in this description can be represented by voltages, currents, electromagnetic waves, magnetic fields or particles, optical fields or particles, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

In the following description, certain terminology is used to describe certain features. The term "mobile device" includes, and is not limited to, a mobile phone, a mobile communication device, a personal digital assistant, a mobile palm-held computer, a wireless device, and/or other types of portable electronic devices typically carried by a person and/or having some form of communication capabilities (e.g., wireless, infrared, short-range radio, etc.).

DESCRIPTION OF THE FIGURES

Examples of Enhanced Static IR Drop Analysis methods include recording time points at which global current demand profile peaks, sampling instantaneous current from individual tile-based current demand profiles at each of the time points, and running Static IR Analysis on the individual tile-based current demand profiles at each of the time points. The Static IR Analysis is performed using multiple scenarios of realistic peak current distribution such that each scenario targets specific areas of the design presenting high IR drop. The areas with high IR drop have a higher risk of PDN failures, and as such should be probed further for potential issues related to inferior power grid mesh connectivity including shorts, opens, missing vias, high mesh resistance, and inadequate decap density.

Figure 1A:
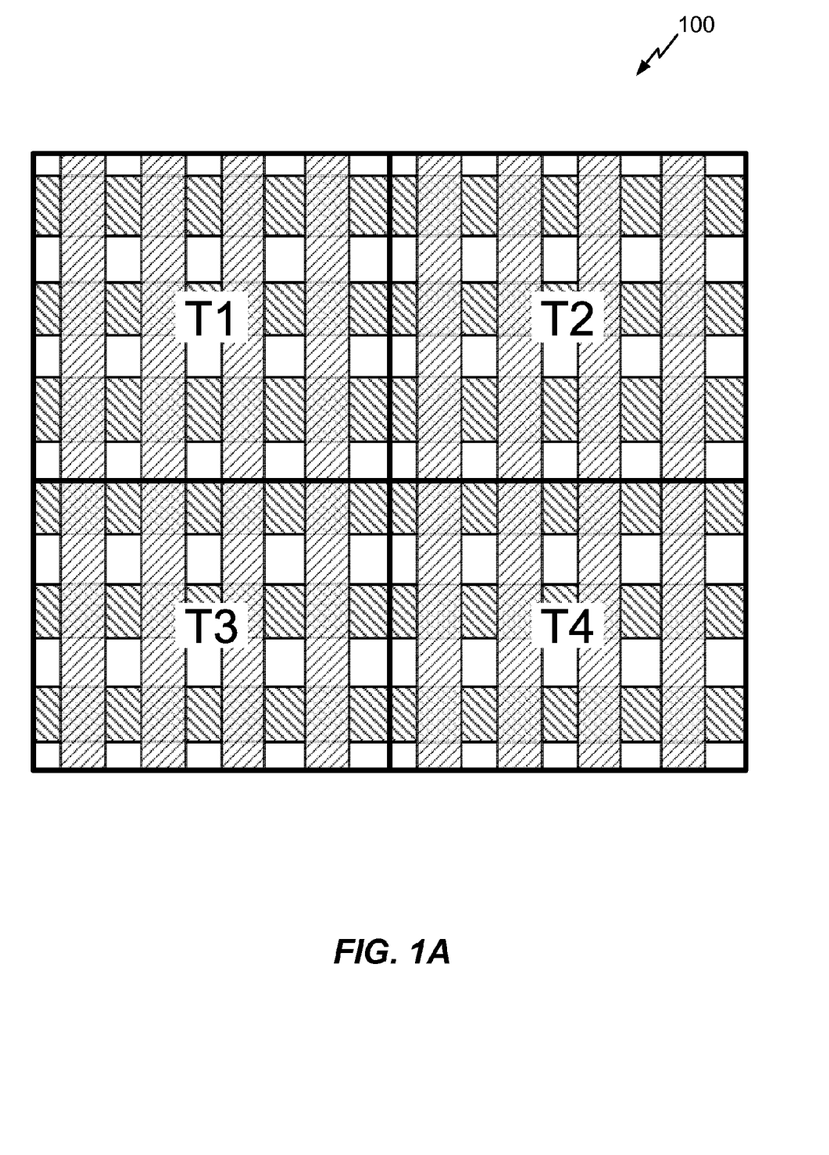
FIG. 1A depicts an exemplary circuit block partitioned into four tiles.
Figure 1B:
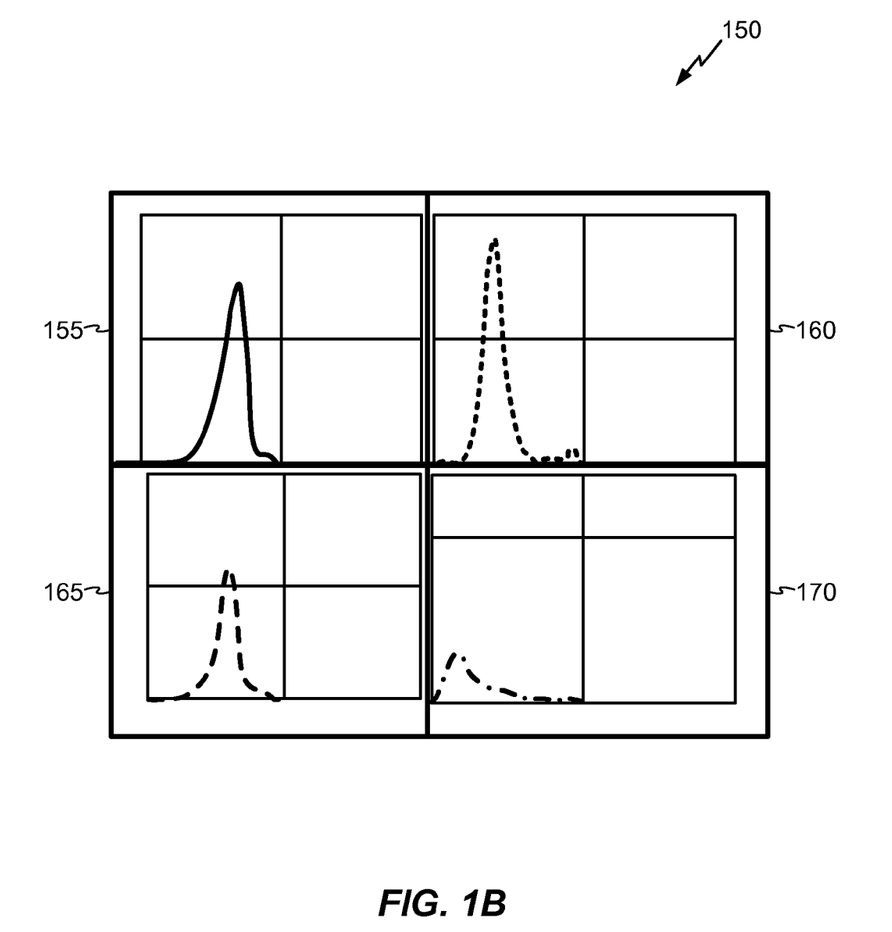
FIG. 1B depicts examples of respective current demand profiles during operation of the exemplary circuit block, over time, for each of the four tiles.
Figure 2:
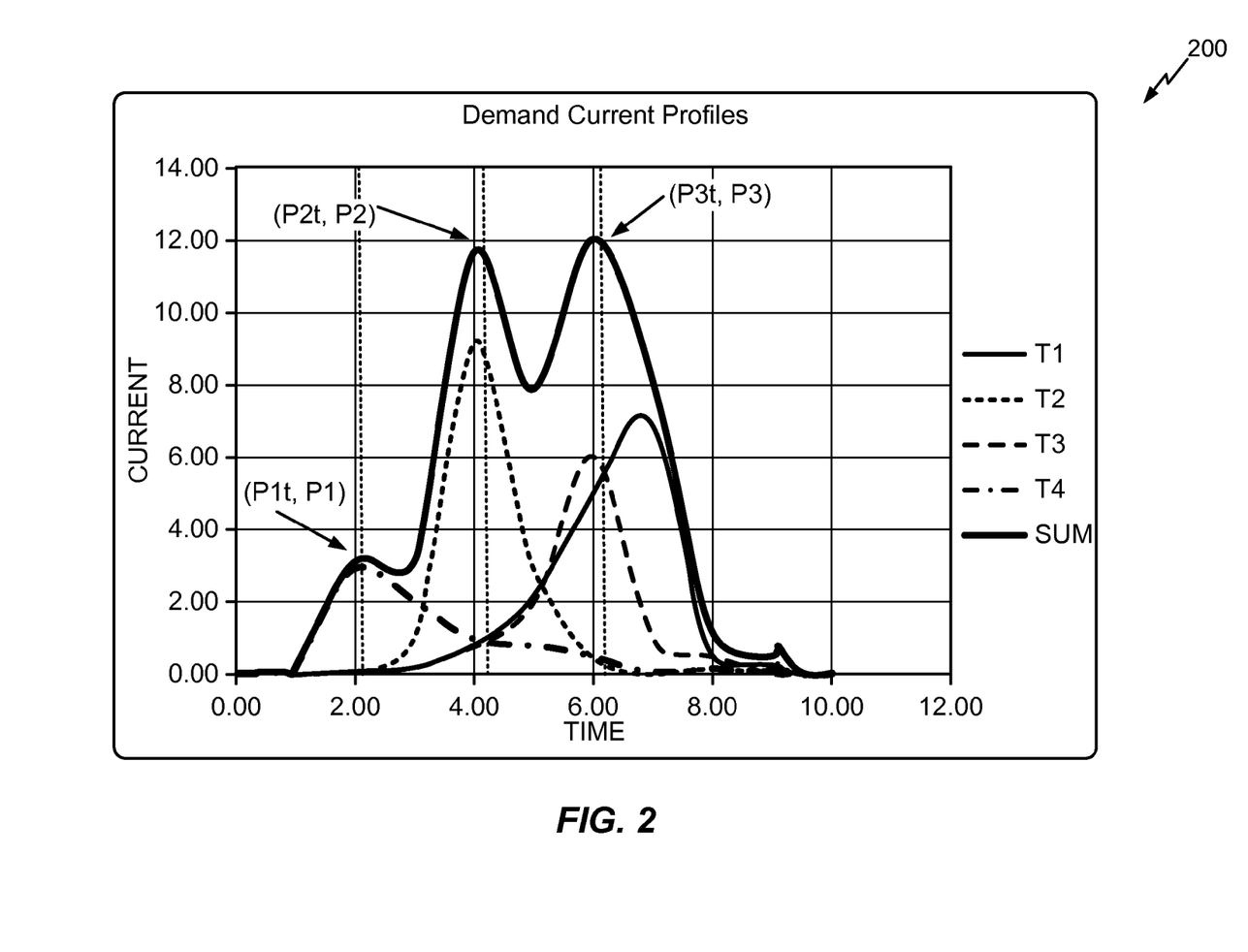
FIG. 2 depicts an exemplary global current demand profile overlaid with the respective individual current demand profiles of the four tiles.

FIGS. 1A-1B and 2 provide an example to help explain Enhanced Static IR Drop Analysis including extraction of peak current values from a current demand profile for a hard macro (HM). An initial step in Enhanced Static IR Drop Analysis is selecting a block of circuitry in a device and dividing the block into tiles. FIG. 1A depicts an exemplary circuit block 100 (i.e., a hard macro) that is partitioned into four tiles, identified as T1, T2, T3, and T4, to enable early analysis at a floorplan stage. Though four tiles are used in the example, in practice, a block can be divided into other quantities of tiles. In an example, the tiles are substantially equal in size.

After portioning the block of circuitry into the tiles, an individual current demand profile for each tile in the plurality of tiles is determined and can be recorded. FIG. 1B depicts examples of respective current demand profiles 150 during operation of the circuit block 100, over time, for each of the tiles T1-T4. The tile T1 has a respective individual current demand profile 155, the tile T2 has a respective current demand profile 160, the tile T3 has a respective current demand profile 165, and the tile T4 has a respective current demand profile 170.

Provided are three methods to create current demand profiles for a tile, listed in order by decreasing accuracy:

In the first method, the current demand profile is based on switching activity of leaf instances (i.e., a cell at the lowest level of a circuit hierarchy). Each leaf instance draws current when switching. Thus, the current demand profile for a tile can be created by adding the current demand profiles of all of the leaf instances inside a tile. A Dynamic Voltage Drop Analysis database for a design usually contains instance-level current demand profile for entire design. A post-processing step can be performed that adds instance-level current demand waveforms to create the respective current demand profile for each tile. This is a very accurate way to generate a current demand profile per tile. The global current demand profile can also be a part of the Dynamic Voltage Drop Analysis database, and can be used to select time points at which instantaneous power is sampled from each tile.

In the second method, if a new block being designed closely mimics a functionality and a size of a previously-analyzed block having a tile-based model representation, then the new block is analyzed using per-tile current demand profiles of the previously-analyzed tiles, as well as the global current demand profile for the previously-analyzed block. With this method, a Dynamic Voltage Drop Analysis database for the new block is not required.

In the third method, a coarser model can be produced by assigning a triangular or trapezoidal current demand profile per tile and then performing waveform addition to produce the global current demand profile. The results of this method could be significantly less accurate than the first and second methods described above, depending upon the accuracy of current profiles estimates and accuracy of a switching timing window relationship between tiles.

After current demand profiles are determined for the tiles, the individual current demand profiles are summed to determine a global current demand profile for the circuit block. FIG. 2 depicts an exemplary global current demand profile 200 overlaid with the respective individual current demand profiles 155, 160, 165, 170 for tiles T1-T4. The global current demand profile 200 is a block-level current demand profile that is a summation of the respective individual current demand profiles 155, 160, 165, 170 of each of the four tiles T1-T4.

After the exemplary global current demand profile is determined, time points at which to sample the current demand profiles are identified. The time points are selected based on the global current demand profile. Referring to FIG. 2, the global current demand profile 200 has three distinct peaks—peak P1 at time P1t (around the two time unit point), peak P2 at time P2t (around the four time unit point), and peak P3 at time P3t (around the six time unit point). The peaks P1-P3 determine the time points P1t, P2t, P3t at which to sample the individual current demand profiles 155, 160, 165, 170.

Figure 3A:
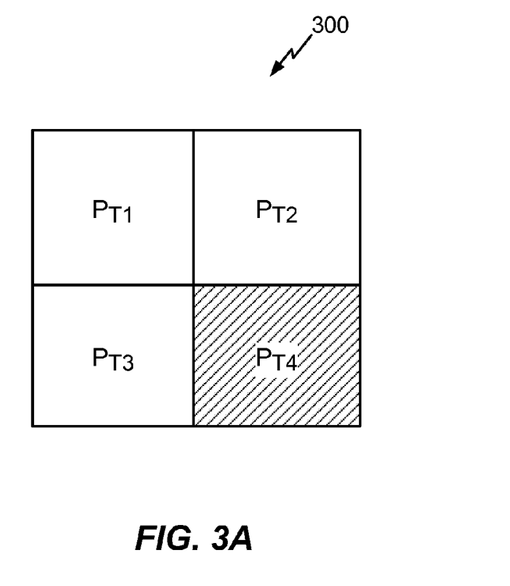
FIGS. 3A-3C depict which of the tiles consumes the highest power during time points at which the exemplary global current demand profile peaks.
Figure 3B:
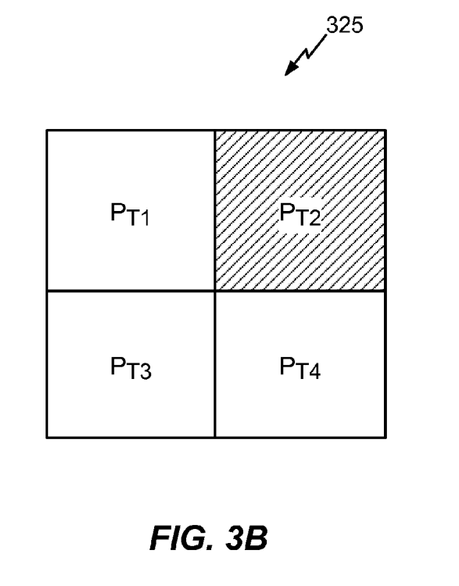
Figure 3C:
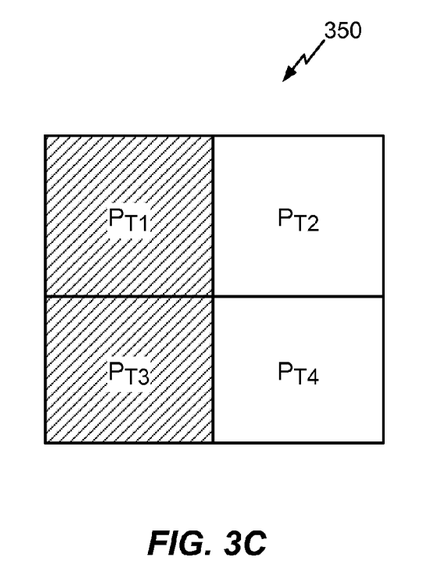

FIGS. 3A-3C depict, using shading, diagrams 300, 325, 350 showing which of the tiles T1-T4 consumes the highest power during the time points P1t, P2t, P3t at which the global current demand profile 200 peaks. FIG. 3A depicts that tile T4 consumes the highest power at time P1t, FIG. 3B depicts that tile T2 consumes the highest power at time P2t, and FIG. 3C depicts that tiles T1 and T3 consume the highest power at time P3t.

After the time points are identified, instantaneous current values for each tile at the time points are determined from the individual current demand profiles for the tiles. For example, at each of the time points P1t, P2t, and P3t, an instantaneous current value from the individual current demand profiles 155, 160, 165, 170 for each tile T1-T4 is identified and recorded. Once the instantaneous current values per tile are recorded, Static IR Analysis is performed on the tiles, using the respective recorded instantaneous current values for each distinct instantaneous current distribution.

Figure 4A:
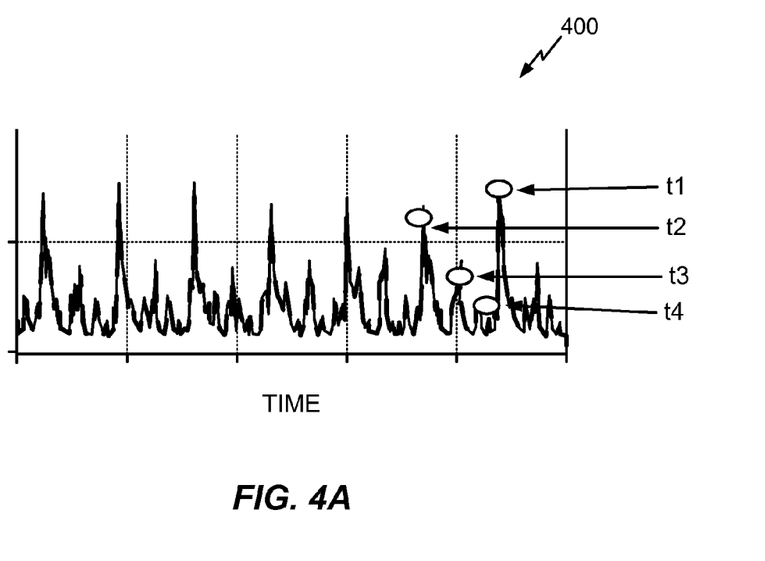
FIG. 4A depicts an example of selected time points from a global current demand profile for an actual chip under test.
Figure 4B:
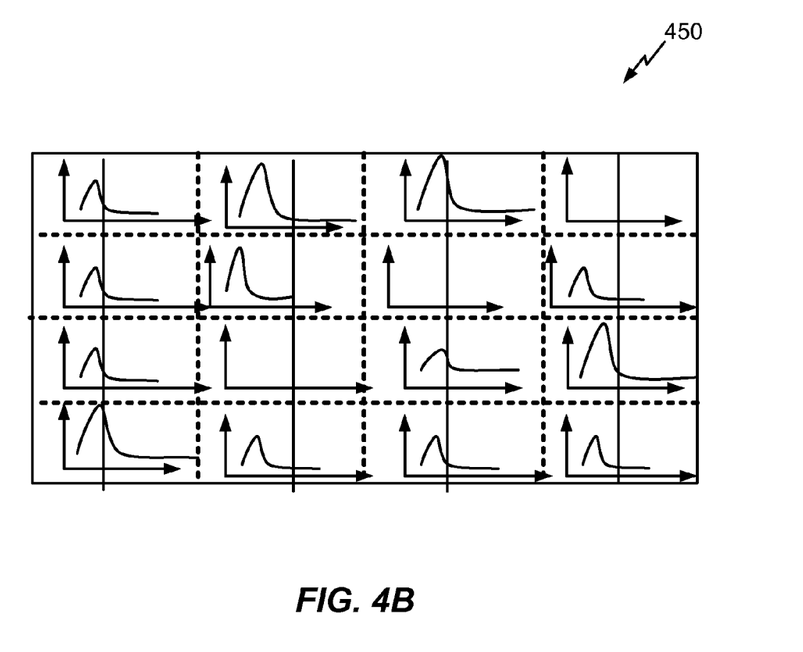
FIG. 4B depicts an exemplary snapshot of current demand profiles per tile, with the vertical lines representing the same time point.

While in the earlier example, circuit block 100 has four tiles T1-T4, a macro block can be partitioned into a much larger number of tiles. FIGS. 4A and 4B depict another example of different demand peaks corresponding to instantaneous currents for a very large number of tiles. FIG. 4A depicts an example 400 of selected time points from a global current demand profile for an actual chip under test. FIG. 4B depicts a snapshot 450 of current demand profiles per tile, with the vertical lines representing the same time point. In practice, smaller tile sizes (i.e., a larger number of tiles per circuit block) lead to peak current distribution analysis results having higher accuracy.

Figure 5:
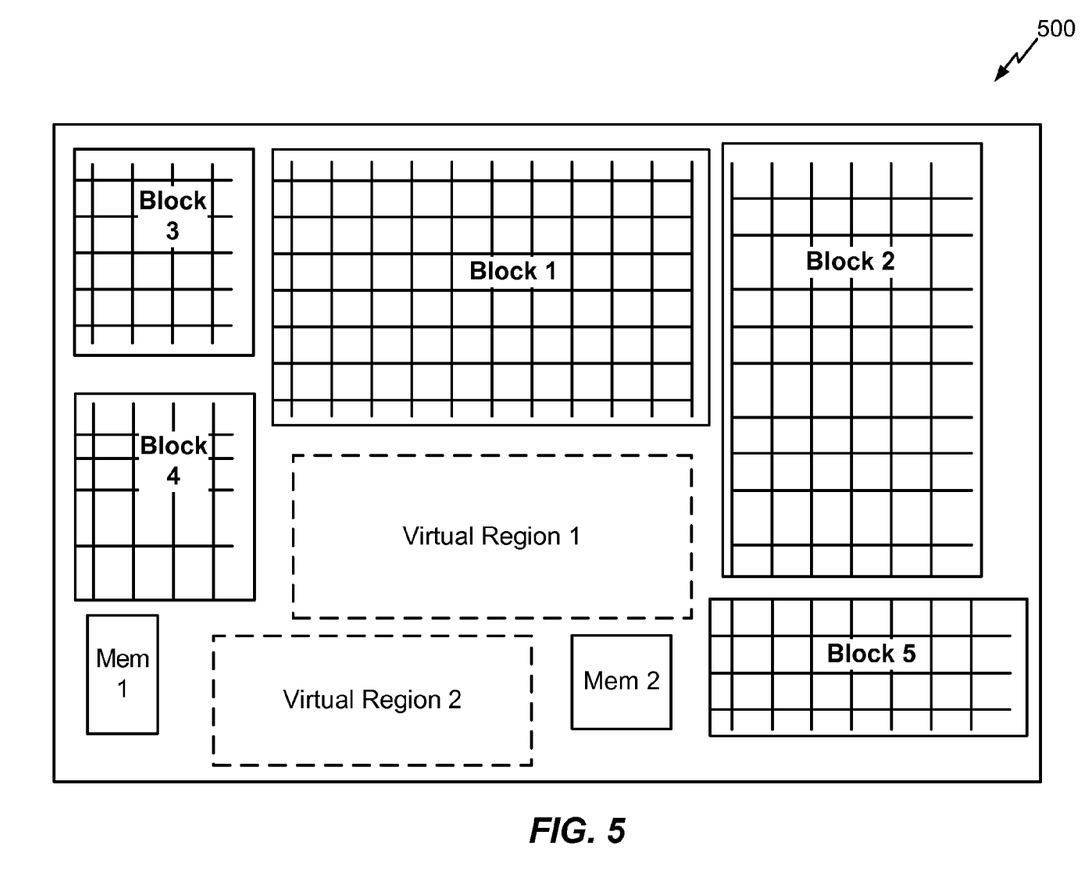
FIG. 5 depicts an exemplary chip showing tile-based representation for blocks, virtual region definitions, and memories.

FIG. 5 depicts an exemplary chip 500 showing tile-based representation for blocks, virtual region definitions, and memories. When designing a chip by using a bottom-up design methodology, there are three levels of logic that can be modeled: hierarchical blocks, memories and/or custom macros, and top level "glue" logic. When performing Enhanced Static IR Drop Analysis, each hierarchical block can be represented by a respective tile-based model. A library of tile-based models can be created for each hierarchical block, with each tile having a respective instantaneous power and individual current demand profile. Thus, there are multiple instantaneous current distributions for each block. One or more of these power distributions can be used and applied to the block during chip-level analysis. FIG. 5 depicts an exemplary chip 500 having five hierarchical blocks and depicts tile-based representation for blocks, virtual region definitions, and memories. Each block has a tile-based representation. For the top level "glue" logic, which cannot make use of any pre-existing tile-based model representation, virtual regions can be defined, and each virtual region can be assigned a worst-case peak power number. The peak power number uniformly represents power distributed inside the virtual region. To determine a peak power number for each virtual region, an estimate of an average power is obtained for the virtual region. The average power is then scaled by a reasonable scaling factor to determine the peak power. The scaling factor can be obtained by calculating ratios for the hierarchical blocks for which both average and peak power numbers are known. Each memory and/or custom block at the top level is assigned a worst-case power number based on data obtained for the memory and/or custom block. When determining the peak power number, increases in accuracy lead to more reliable Enhanced Static IR Drop Analysis at the chip level. Multiple iterations of Static IR Analysis based on the peak power number can be performed.

Figure 6:
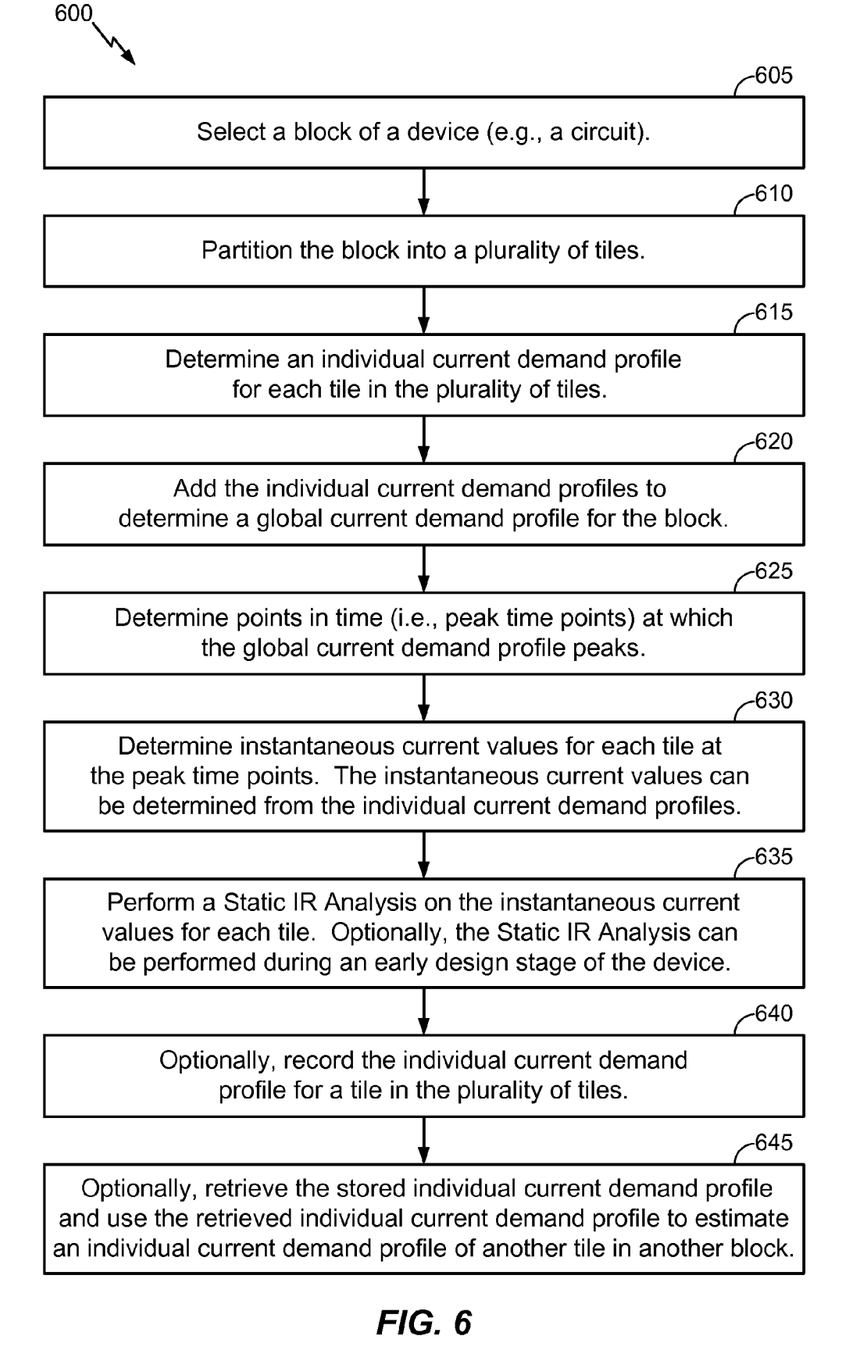
FIG. 6 depicts an exemplary method for performing Enhanced Static IR Drop Analysis on a device.

FIG. 6 depicts an exemplary method 600 for performing Enhanced Static IR Drop Analysis on a device (i.e., a circuit). The method for performing Enhanced Static IR Drop Analysis on a device can be performed by the apparatus described hereby, such as a processor configured to perform at least a part of a method described herein.

In step 605, a block of the device is selected.

In step 610, the block is partitioned into a plurality of tiles.

In step 615, an individual current demand profile for each tile in the plurality of tiles is determined.

In step 620, the individual current demand profiles are added to determine a global current demand profile for the block.

In step 625, peak time points at which the global current demand profile peaks are determined.

In step 630, instantaneous current values for each tile at the peak time points are determined from the individual current demand profiles.

In step 635, a Static IR Analysis is performed on the instantaneous current values for each tile. Optionally, the Static IR Analysis can be performed during an early design stage of the device.

In optional step 640, the individual current demand profile for a tile in the plurality of tiles is recorded.

In optional step 645, the individual current demand profile for a tile in the plurality of tiles that was stored in optional step 640 is retrieved and used to estimate an individual current demand profile of another tile (e.g., a second tile) in another block (e.g., a second block).

Figure 7A:
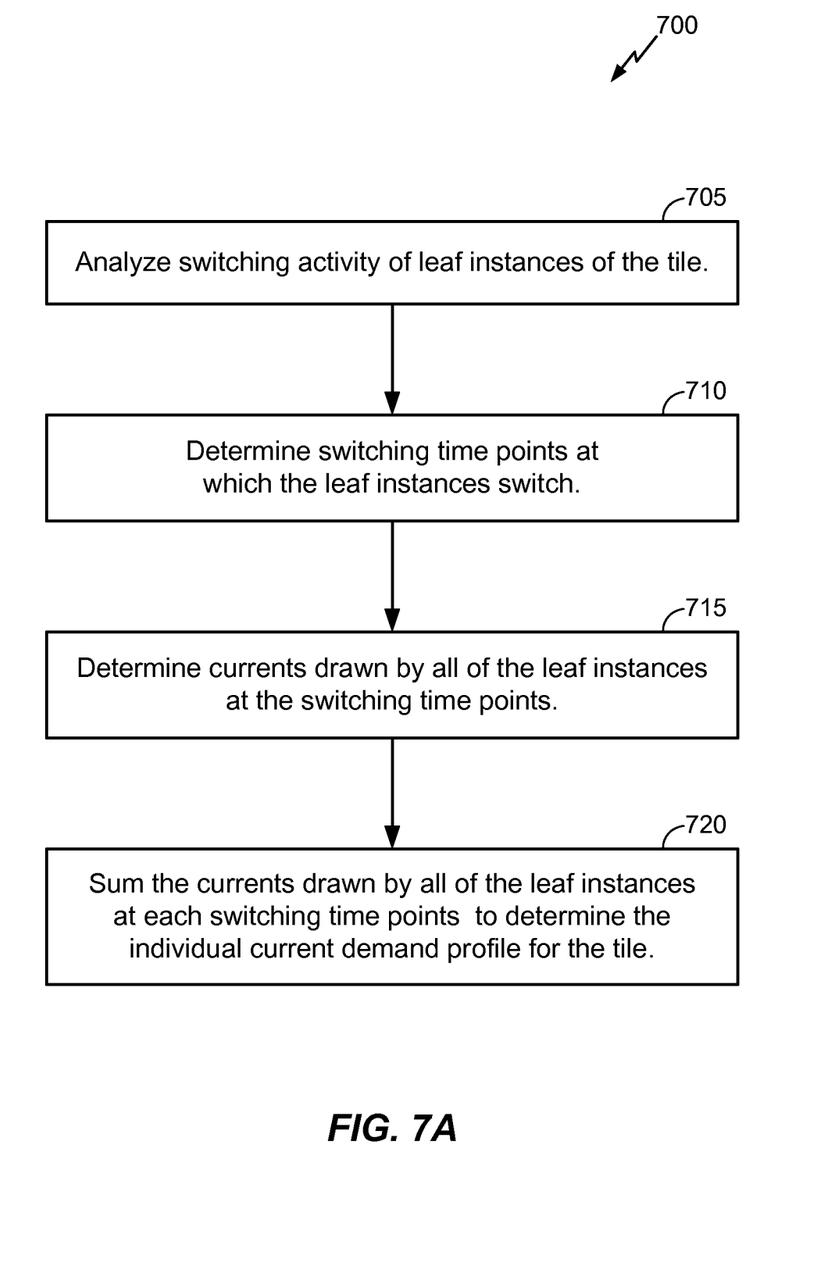
FIGS. 7A-7C depict exemplary methods to determine an individual current demand profile for a tile.

FIG. 7A depicts an exemplary method 700 that can be used to determine the individual current demand profile for a tile in step 615.

In step 705, switching activity of leaf instances of the tile is analyzed.

In step 710, switching time points at which the leaf instances switch are determined.

In step 715, currents drawn by all of the leaf instances at the switching time points are determined.

In step 720, the currents drawn by all of the leaf instances at each switching time points are summed to determine the individual current demand profile for the tile.

Figures 7B, 7C:
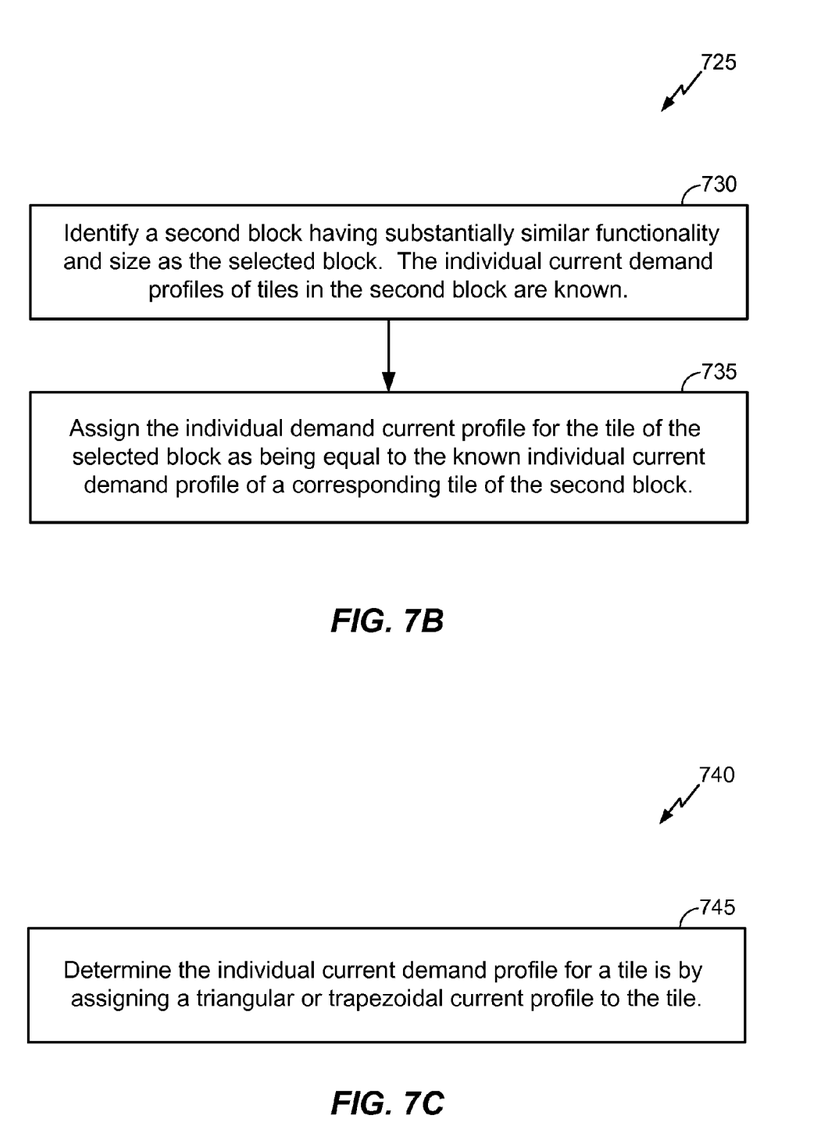

FIG. 7B depicts an exemplary method 725 that can be used to determine the individual current demand profile for a tile in step 615.

In step 730, a second block having substantially similar functionality and size as the selected block is identified. The individual current demand profiles of tiles in the second block are known.

in step 735, the individual current demand profile for the tile of the selected block is assigned as being equal to the known individual current demand profile of a corresponding tile of the second block.

FIG. 7C depicts an exemplary method 740 that can be used to determine the individual current demand profile for a tile in step 615.

In step 745, the individual current demand profile for a tile is determined by assigning a triangular or trapezoidal current demand profile to the tile.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC- FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO Re1O, RevA, RevB) technology and other technologies. The techniques can be used in emerging and future networks and interfaces, including Long Term Evolution (LTE).

At least a portion of the methods, sequences, and/or algorithms described in connection with the embodiments disclosed herein may be embodied directly in hardware, in a software module executed by a processor, or in a combination of the two. In an example, a processor includes multiple discrete hardware components. A software module may reside in RAM memory, flash memory, ROM memory, EPROM memory, EEPROM memory, registers, hard disk, a removable disk, a CD-ROM, and/or any other form of storage medium known in the art. An exemplary storage medium can be coupled to the processor such that the processor can read information from, and write information to, the storage medium. In an alternative, the storage medium may be integral with the processor.

Further, many embodiments are described in terms of sequences of actions to be performed by, for example, elements of a computing device. Various actions described herein can be performed by a specific circuit (e.g., an application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, a corresponding circuit of any such embodiments may be described herein as, for example, "logic configured to" perform a described action.

An embodiment of the invention can include a non-transitory computer readable media embodying a method described herein. Accordingly, the invention is not limited to illustrated examples and any means for performing the functionality described herein are included in embodiments of the invention.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a computer-readable media. The file can be provided to a fabrication handler who fabricates with a lithographic device, based on the file, an integrated device. In an example, the integrated device is on a semiconductor wafer. The semiconductor wafer can be cut into a semiconductor die and packaged into a semiconductor chip. The semiconductor chip can be employed in a device described herein (e.g., a mobile device).

Embodiments can include a machine-readable media and/or a non-transitory computer-readable media embodying instructions which, when executed by a processor, transform a processor and any other cooperating devices into a machine configured to perform at least a part of a function described hereby.

Nothing stated or depicted herein is intended to cause a dedication of any component, step, feature, object, benefit, advantage, or equivalent to the public, regardless of whether the component, step, feature, object, benefit, advantage, or the equivalent is recited in the claims.

While this disclosure describes exemplary embodiments of the invention, it should be noted that various changes and modifications could be made herein without departing from the scope of the invention as defined by the appended claims.

What is claimed is:

1. A method for performing enhanced static IR analysis on a device, comprising:
   selecting a block of the device;
   partitioning the block into a plurality of tiles;
   determining an individual current demand profile for each tile in the plurality of tiles;
   adding the individual current demand profiles to determine a global current demand profile for the block;
   determining peak time points at which the global current demand profile peaks;
   determining, from the individual current demand profiles, instantaneous current values for each tile at the peak time points; and
   performing a static IR analysis on the instantaneous current values for each tile to identify a power grid connectivity deficiency.

2. The method of claim 1, wherein the individual current demand profile for a tile is determined by:
   analyzing switching activity of leaf instances of the tile;
   determining switching time points at which the leaf instances switch;
   determining currents drawn by the leaf instances at the switching time points; and
   summing the currents drawn by the leaf instances at the switching time points to determine the individual current demand profile for the tile.

3. The method of claim 1, wherein the individual current demand profile for a tile is determined by:
   identifying a second block having substantially similar functionality and size as the selected block, wherein individual current demand profiles of tiles in the second block are known; and assigning the individual current demand profile for the tile of the selected block to be equal to the known individual current demand profile of a corresponding tile of the second block.

4. The method of claim 1, wherein the individual current demand profile for a tile is determined by assigning a triangular or trapezoidal current demand profile to the tile.

5. The method of claim 1, wherein the static IR analysis is performed during an early design stage of the device.

6. The method of claim 1, further comprising recording the individual current demand profile for a tile of the plurality of tiles.

7. The method of claim 6, further comprising retrieving the individual current demand profile for a tile of the plurality of tiles and using the retrieved individual current demand profile to estimate an individual current demand profile of a second tile in a second block.

8. An apparatus configured to perform enhanced static IR analysis on a device, comprising:
    means for selecting a block of the device;
    means for partitioning the block into a plurality of tiles;
    means for determining an individual current demand profile for each tile in the plurality of tiles;
    means for adding the individual current demand profiles to determine a global current demand profile for the block;
    means for determining peak time points at which the global current demand profile peaks;
    means for determining, from the individual current demand profiles, instantaneous current values for each tile at the peak time points; and
    means for performing a static IR analysis on the instantaneous current values for each tile to identify a power grid connectivity deficiency.

9. The apparatus of claim 8, wherein the individual current demand profile for a tile is determined by:
    means for analyzing switching activity of leaf instances of the tile;
    means for determining switching time points at which the leaf instances switch;
    means for determining currents drawn by the leaf instances at the switching time points; and
    means for summing the currents drawn by the leaf instances at the switching time points to determine the individual current demand profile for the tile.

10. The apparatus of claim 8, wherein the individual current demand profile for a tile is determined by:
    means for identifying a second block having substantially similar functionality and size as the selected block, wherein individual current demand profiles of tiles in the second block are known; and
    means for assigning the individual current demand profile for the tile of the selected block to be equal to the known individual current demand profile of a corresponding tile of the second block.

11. The apparatus of claim 8, wherein the individual current demand profile for a tile is determined by means for assigning a triangular or trapezoidal current demand profile to the tile.

12. The apparatus of claim 8, wherein the static IR analysis is performed during an early design stage of the device.

13. The apparatus of claim 8, further comprising means for recording the individual current demand profile for a tile of the plurality of tiles.

14. The apparatus of claim 13, further comprising means for retrieving the individual current demand profile for a tile of the plurality of tiles and using the retrieved individual current demand profile to estimate an individual current demand profile of a second tile in a second block.

15. The apparatus of claim 8, wherein at least a part of the apparatus is integrated on a semiconductor die.

16. An apparatus configured to perform enhanced static IR analysis on a device, comprising:
    a processor configured to:
        select a block of the device;
        partition the block into a plurality of tiles;
        determine an individual current demand profile for each tile in the plurality of tiles;
        add the individual current demand profiles to determine a global current demand profile for the block;
        determine peak time points at which the global current demand profile peaks;
        determine, from the individual current demand profiles, instantaneous current values for each tile at the peak time points; and
        perform a static IR analysis on the instantaneous current values for each tile to identify a power grid connectivity deficiency.

17. The apparatus of claim 16, wherein the processor is further configured to determine the individual current demand profile for a tile by:
    analyzing switching activity of leaf instances of the tile;
    determining switching time points at which the leaf instances switch;
    determining currents drawn by the leaf instances at the switching time points; and
    summing the currents drawn by the leaf instances at the switching time points to determine the individual current demand profile for the tile.

18. The apparatus of claim 16, wherein the processor is further configured to determine the individual current demand profile for a tile by:
    identifying a second block having substantially similar functionality and size as the selected block, wherein individual current demand profiles of tiles in the second block are known; and
    assigning the individual current demand profile for the tile of the selected block to be equal to the known individual current demand profile of a corresponding tile of the second block.

19. The apparatus of claim 16, wherein the processor is further configured to determine the individual current demand profile for a tile by assigning a triangular or trapezoidal current demand profile to the tile.

20. The apparatus of claim 16, wherein the processor is configured to perform the static IR analysis during an early design stage of the device.

21. The apparatus of claim 16, wherein the processor is further configured to record the individual current demand profile for a tile of the plurality of tiles.

22. The apparatus of claim 21, wherein the processor is further configured to retrieve the individual current demand profile for a tile of the plurality of tiles and use the retrieved individual current demand profile to estimate an individual current demand profile of a second tile in a second block.

23. The apparatus of claim 16, wherein at least a part of the apparatus is integrated on a semiconductor die.

24. A non-transitory computer-readable medium, comprising instructions stored thereon that, if executed by a processor, cause the processor to execute a method comprising:
    selecting a block of the device;
    partitioning the block into a plurality of tiles;
    determining an individual current demand profile for each tile in the plurality of tiles;

adding the individual current demand profiles to determine a global current demand profile for the block;

determining peak time points at which the global current demand profile peaks;

determining, from the individual current demand profiles, instantaneous current values for each tile at the peak time points; and performing a static IR analysis on the instantaneous current values for each tile to identify a power grid connectivity deficiency.

25. The non-transitory computer-readable medium of claim 24, wherein the method further comprises determining the individual current demand profile for a tile by:

analyzing switching activity of leaf instances of the tile;

determining switching time points at which the leaf instances switch;

determining currents drawn by the leaf instances at the switching time points; and summing the currents drawn by the leaf instances at the switching time points to determine the individual current demand profile for the tile.

26. The non-transitory computer-readable medium of claim 24, wherein the method further comprises determining the individual current demand profile for a tile by:

identifying a second block having substantially similar functionality and size as the selected block, wherein individual current demand profiles of tiles in the second block are known; and assigning the individual current demand profile for the tile of the selected block to be equal to the known individual current demand profile of a corresponding tile of the second block.

27. The non-transitory computer-readable medium of claim 24, wherein the method further comprises determining the individual current demand profile for a tile by assigning a triangular or trapezoidal current demand profile to the tile.

28. The non-transitory computer-readable medium of claim 24, wherein the static IR analysis is performed during an early design stage of the device.

29. The non-transitory computer-readable medium of claim 24, wherein the method further comprises recording the individual current demand profile for a tile of the plurality of tiles.

30. The non-transitory computer-readable medium of claim 29, wherein the method further comprises retrieving the individual current demand profile for a tile of the plurality of tiles and using the retrieved individual current demand profile to estimate an individual current demand profile of a second tile in a second block.

* * * * *